United States Patent
Yosui

(10) Patent No.: US 9,324,491 B2
(45) Date of Patent: Apr. 26, 2016

(54) INDUCTOR DEVICE AND ELECTRONIC APPARATUS

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/863,790

(22) Filed: Sep. 24, 2015

(65) Prior Publication Data

US 2016/0012963 A1      Jan. 14, 2016

Related U.S. Application Data

(63) Continuation of application No. PCT/JP2014/080305, filed on Nov. 17, 2014.

(30) Foreign Application Priority Data

Dec. 6, 2013   (JP) .................................. 2013-252586

(51) Int. Cl.
| | |
|---|---|
| *H01F 5/00* | (2006.01) |
| *H01F 27/29* | (2006.01) |
| *H01F 17/00* | (2006.01) |
| *H01F 27/28* | (2006.01) |
| *H05K 1/18* | (2006.01) |

(52) U.S. Cl.
CPC ................. *H01F 27/29* (2013.01); *H01F 5/00* (2013.01); *H01F 17/0013* (2013.01); *H01F 27/2804* (2013.01); *H01F 27/292* (2013.01); *H05K 1/18* (2013.01); *H01F 2027/2809* (2013.01)

(58) Field of Classification Search
CPC ........................ H01F 5/00; H01F 27/00–27/30
USPC ....................... 336/65, 83, 200, 232, 206–208
See application file for complete search history.

(56) References Cited

U.S. PATENT DOCUMENTS

| | | | | |
|---|---|---|---|---|
| 7,064,645 | B2 * | 6/2006 | Kobayashi | .......... H01F 17/0006 257/E23.114 |
| 7,746,232 | B2 * | 6/2010 | Hashimoto | ............... H01F 5/00 336/200 |
| 9,251,942 | B2 * | 2/2016 | Hashimoto | .......... H01L 23/3114 |
| 2003/0080846 | A1 * | 5/2003 | Chang | .................... H03H 11/48 336/223 |
| 2007/0176845 | A1 * | 8/2007 | Yamazaki | ........ G06K 19/07728 343/895 |

FOREIGN PATENT DOCUMENTS

| | | |
|---|---|---|
| JP | 2007-317838 A | 12/2007 |
| WO | 2012/144360 A1 | 10/2012 |
| WO | 2014/129279 A1 | 8/2014 |

OTHER PUBLICATIONS

Official Communication issued in International Patent Application No. PCT/JP2014/080305, mailed on Jan. 6, 2015.

* cited by examiner

*Primary Examiner* — Tuyen Nguyen
(74) *Attorney, Agent, or Firm* — Keating & Bennet, LLP

(57) ABSTRACT

An inductor device includes a layer-laminated member with laminated base-material layers and a coil with a winding axis coincident with a direction of layer lamination, a smaller-thickness portion near one end portion thereof in the direction of layer lamination, and a greater-thickness portion with more base-material layers than that in the smaller-thickness portion. The coil is located in the greater-thickness portion. The coil is connected, at its one end positioned near one end portion of the layer-laminated member, to a conductor pattern in the smaller-thickness portion. The coil is connected, at its other end positioned near the other end portion of the layer-laminated member, to a conductor pattern in a base-material layer located near the other end portion of the layer-laminated member. The conductor patterns are located at respective different positions in the direction of layer lamination.

15 Claims, 9 Drawing Sheets

INDUCTOR DEVICE AND ELECTRONIC APPARATUS

BACKGROUND OF THE INVENTION

1. Field of the Invention

The present invention relates to inductor devices and electronic apparatuses which include layer-laminated members constituted by base-material layers laminated therein such that coils are provided in the layer-laminated members.

2. Description of the Related Art

JP-A No. 2007-317838 discloses a surface-mounted coil constituted by plural wiring layers provided with coil wiring patterns which are laminated, such that the direction of layer lamination is coincident with the direction of the coil winding axis. This surface-mounted coil is adapted such that the outer surface (the bottom surface) of the lowermost layer forms a mounting surface, and a connection electrode connected to the coil wiring on the lowermost layer and a connection electrode connected to the coil wiring on the uppermost layer are provided on the outer surface (the bottom surface) of the lowermost layer. The coil wiring on the uppermost layer is connected to the connection electrode formed on the outer surface of the lowermost layer, through a connection portion extending along the direction of the coil winding axis (the direction of layer lamination), near a side of the coil.

However, in the surface-mounted coil described in JP-A No. 2007-317838, since the connection portion for connecting an end portion of the coil wiring on the uppermost layer to the connection electrode on the lowermost layer is extended along the direction of the coil winding axis (the direction of layer lamination) near a side of the coil, due to magnetic fields generated from the coil, eddy currents in the connection portion generate electric power losses, which is a problem.

SUMMARY OF THE INVENTION

Preferred embodiments of the present invention provide an inductor device and an electronic apparatus which significantly reduce or prevent eddy currents to significantly reduce or prevent electric power losses.

According to a preferred embodiment of the present invention, an inductor device includes a layer-laminated member including base-material layers laminated, and a coil arranged in the layer-laminated member such that a winding axis thereof is coincident with a direction of layer lamination, wherein the layer-laminated member includes a smaller-thickness portion positioned near one end portion thereof in the direction of layer lamination, and a greater-thickness portion including a greater number of base-material layers laminated therein than that in the smaller-thickness portion, the coil is provided in the greater-thickness portion, the coil is connected, at its one end positioned near one end portion of the layer-laminated member, to a first terminal portion provided in the smaller-thickness portion, the coil is connected, at its other end positioned near the other end portion of the layer-laminated member, to a second terminal portion located in a base-material layer near the other end portion of the layer-laminated member, and the first terminal portion and the second terminal portion are located at respective different positions in the direction of layer lamination.

With this structure, the first terminal portion and the second terminal portion which are connected to the both ends of the coil are located near the respective end portions of the layer-laminated member in the direction of layer lamination, which prevents the conductor line paths which connect the both ends of the coil to the first terminal portion and the second terminal portion from being disposed along the coil winding axis near a side of the coil or, also, shorten the lengths of the portions of the conductor line paths which are located along the coil winding axis near a side of the coil. This significantly reduces or prevents the occurrence of eddy currents in the conductor line paths due to magnetic fields generated from the coil, thus resulting in reduction or prevention of electric power losses.

The first terminal portion and the second terminal portion are preferably located at positions which prevent respective conductor line paths which connect both the ends of the coil to the first terminal portion and the second terminal portion from being located in the greater-thickness portion, along a direction of the winding axis of the coil, near a side of the coil.

With this structure, it is possible to significantly reduce or prevent the occurrence of eddy currents in the respective conductor line paths which connect the both ends of the coil to the first terminal portion and the second terminal portion, due to magnetic fields generated from the coil. This further reduces electric power losses. Further, if the conductor line paths are located along the coil near the coil, this will generate capacitances therebetween, which may change the coil characteristics. However, since the conductor line paths are not located along the coil, it is possible to significantly reduce or prevent the risk thereof.

The first terminal portion and the second terminal portion are preferably located at positions which do not overlap with the coil, in a plan view of the layer-laminated member.

With this structure, the first terminal portion and the second terminal portion do not overlap with the coil, which significantly reduces or prevents the occurrence of stray capacitances between the coil and the first terminal portion and the second terminal portion.

Preferably, the smaller-thickness portion has flexibility, and a connector is connected to the first terminal portion provided in the smaller-thickness portion.

With this structure, the smaller-thickness portion provided with the first terminal portion has flexibility, which enables easily performing the connection operation utilizing the flexibility of the smaller-thickness portion, in connecting the connector connected to the first terminal portion to another substrate and the like.

Preferably, the layer-laminated member includes two or more smaller-thickness portions, and the smaller-thickness portions are located near both the respective end portions of the layer-laminated member in the direction of layer lamination.

With this structure, the smaller-thickness portions are located near the both end portions of the layer-laminated member, which enables reduction of the space for the inductor device.

Preferably, the first terminal portion is located on an outermost layer near one end of the layer-laminated member in the direction of layer lamination, and the second terminal portion is located on an outermost layer near the other end of the layer-laminated member in the direction of layer lamination.

With this structure, it is possible to significantly reduce or prevent the occurrence of eddy currents in the conductor line paths which connect the both ends of the coil to the first terminal portion and the second terminal portion, due to magnetic fields generated from the coil. Further, it is possible to prevent fluctuations of the coil characteristics due to capacitances generated between the conductor line paths and the coil.

According to various preferred embodiments of the present invention, the first terminal portion and the second terminal portion which are connected to the both ends of the coil are located near the respective end portions of the layer-laminated member in the direction of layer lamination. Therefore, it is possible to prevent the conductor line paths which connect the both ends of the coil to the first terminal portion and the second terminal portion from being located along the coil winding axis near a side of the coil or, also, it is possible to shorten the length of the portions of the conductor line paths which are located along the coil winding axis near a side of the coil. This significantly reduces or prevents the occurrence of eddy currents in the conductor line paths, due to magnetic fields generated from the coil, thus resulting in reduction of electric power losses.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
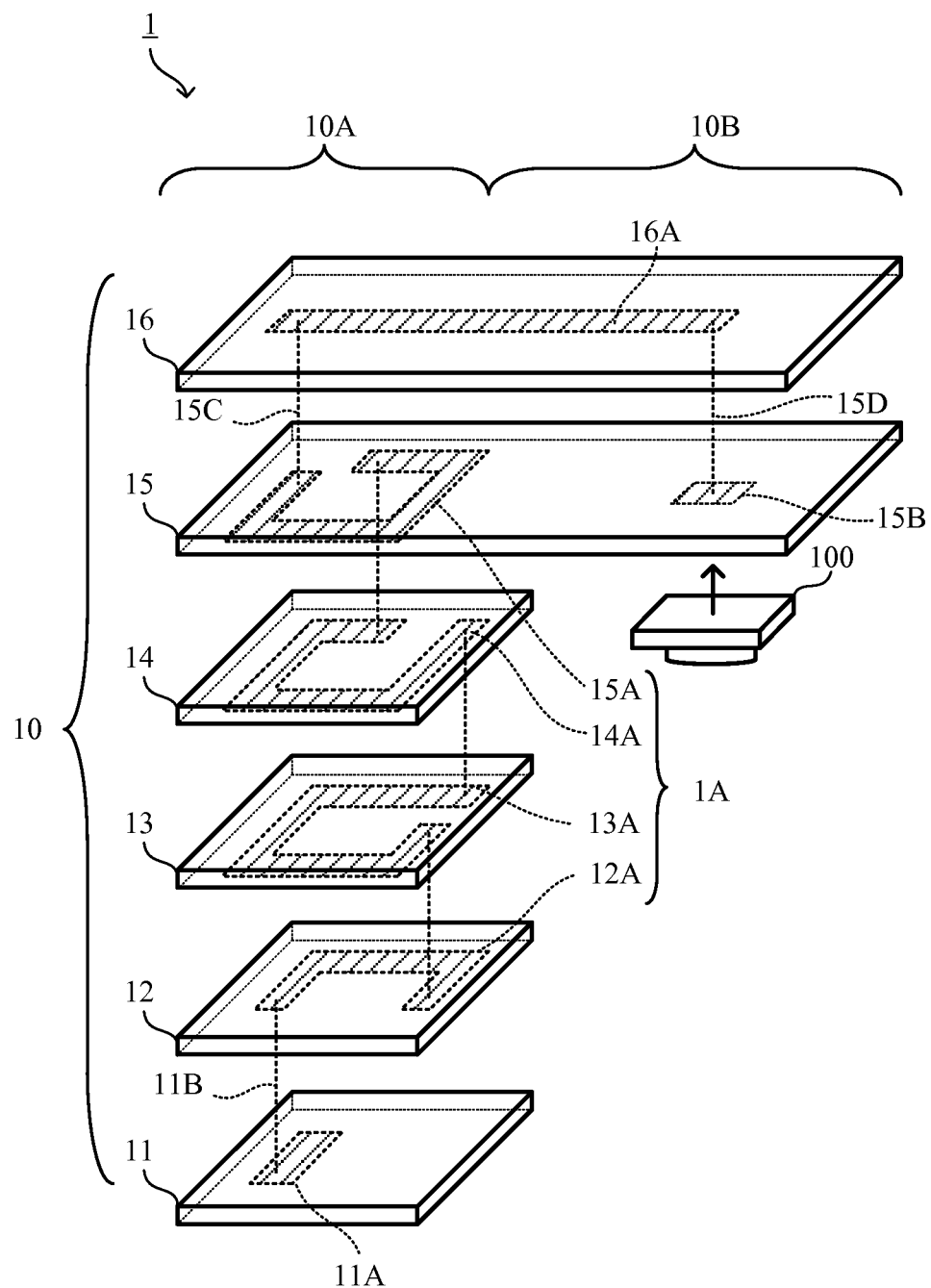
FIG. 1 is an exploded perspective view of an inductor device according to a first preferred embodiment of the present invention.

FIG. 1 is an exploded perspective view of an inductor device according to a first preferred embodiment of the present invention. FIG. 1 illustrates a view of the same in a partially-transparent manner.

An inductor device 1 includes a layer-laminated member provided with a coil 1A. The layer-laminated member 10 includes base-material layers 11, 12, 13, 14, 15 and 16 made of a thermoplastic resin having flexibility, such as an LCP resin (liquid crystal polymer resin), which have been thermally pressed. The base-material layers 11 to 14 have a substantially-square shape. The base-material layers 15 and 16 preferably are rectangular or substantially rectangular including shorter sides with the same length as that of a side of the base-material layers 11 to 14, and longer sides with a greater length than that of the shorter sides thereof.

In the layer-laminated member 10, the respective layers 11 to 16 are formed from an LCP resin with lower permittivity, which makes the capacitances between the wires in the coil 1A smaller and, further, enables forming these layers at a relatively-lower temperature, in comparison with cases of using ceramics and the like. As such a thermoplastic resin, there are PEEK (polyetheretherketone), PEI (polyetherimide), PPS (polyphenylene sulfide), PI (polyimide), and the like, and these can be employed instead of the liquid crystal polymer resin.

On one main surface (a lower surface in FIG. 1) of the base-material layer 11, a conductor pattern 11a preferably with a rectangular or substantially rectangular shape is provided. The base-material layer 11 is an outermost layer in the layer-laminated member 10, and the inductor device 1 is mounted on a substrate, such that the main surface provided with the conductor pattern 11a, in the base-material layer 11, is used as a mounting surface. Accordingly, the conductor pattern 11A is used as a mounting electrode in the inductor device 1. The conductor pattern 11A is an example of "a second terminal portion".

Further, in the base-material layer 11, a via conductor 11B is provided at a position which overlaps with the conductor pattern 11A in a plan view. The via conductor 11B connects the conductor pattern 11A to the other end of the coil 1A. The via conductor 11B is an example of "a conductor line path".

On one main surface (a lower surface in FIG. 1) of the base-material layer 12, a conductor pattern 12A is provided. The base-material layer 12 is laminated on the base-material layer 11, such that the main surface thereof which is provided with the conductor pattern 12A is closer to the base-material layer 11. The conductor pattern 12A has a band shape and is wound in such a way as to define an interior space. The conductor pattern 12A is connected, at its one end, to the conductor pattern 11A through the via conductor in the base-material layer 11.

On one main surface (a lower surface in FIG. 1) of the base-material layer 13, a conductor pattern 13A is provided. The base-material layer 13 is laminated on the base-material layer 12, such that the main surface thereof which is provided with the conductor pattern 13A is closer to the base-material layer 12. The conductor pattern 13A has a band shape and is wound in such a way as to define an interior space. The conductor pattern 13A overlaps with the conductor pattern 12A in a plan view. The conductor pattern 13A is connected, at its one end, to one end of the conductor pattern 12A through a via conductor in the base-material layer 12.

On one main surface (a lower surface in FIG. 1) of the base-material layer 14, a conductor pattern 14A is provided. The base-material layer 14 is laminated on the base-material layer 13, such that the main surface thereof which is provided with the conductor pattern 14A is closer to the base-material layer 13. The conductor pattern 14A has a band shape and is wound in such a way as to define an interior space. The conductor pattern 14A overlaps with the conductor patterns 12A and 13A in a plan view. The conductor pattern 14A is connected, at its one end, to one end of the conductor pattern 13A through a via conductor in the base-material layer 13.

On one main surface (a lower surface in FIG. 1) of the base-material layer 15, conductor patterns 15A and 15B are provided. The base-material layer 15 is laminated on the base-material layer 14, such that the main surface thereof which is provided with the conductor patterns 15A and 15B is closer to the base-material layer 14. The base-material layer 15 includes longer sides which are longer than a side of the base-material layers 11 to 14. Therefore, in the case where the base-material layer 15 is laminated on the base-material layer 14 such that one end portion of the base-material layer 15 is aligned with the base-material layer 14, the base-material layer 15 includes a portion overlapping with the base-material layers 11 to 14, and a portion which is not overlapping therewith, in a plan view.

The conductor pattern 15A is provided on the portion overlapping with the base-material layers 11 to 14, in the base-material layer 15. The conductor pattern 15A has a band shape and is wound in such a way as to define an interior space. The conductor pattern 15A overlaps with the conductor patterns 12A to 14A in a plan view. The conductor pattern 15A is connected, at its one end, to one end of the conductor pattern 14A through a via conductor in the base-material layer 14.

These conductor patterns 12A, 13A, 14A and 15A are connected to each other through the via conductors to define the coil 1A.

The conductor pattern 15B is provided on the portion which is not overlapping with the base-material layers 11 to 14, in the base-material layer 15. Accordingly, the conductor pattern 15B is provided on the portion which is not overlapping with the coil 1A in a plan view. The portion of the base-material layer 15 which is not overlapping with the base-material layers 11 to 14 and is provided with the conductor pattern 15B defines a mounting surface of the inductor device 1. Accordingly, the conductor pattern 15B is used as a mounting electrode in the inductor device 1. The conductor pattern 15B is an example of "a first terminal portion".

Further, in the base material layer 15, via conductors 15C and 15D are provided. The via conductor 15C overlaps with the conductor pattern 15A in a plan view, and the via conductor 15D overlaps with the conductor pattern 15B in a plan view.

On one main surface (a lower surface in FIG. 1) of the base-material layer 16, a conductor pattern 16A is provided. The base-material layer 16 is laminated on the base-material layer 15, such that the main surface thereof which is provided with the conductor pattern 16A is closer to the base-material layer 15. The conductor pattern 16A has a band shape extending in the longitudinal direction of the base-material layer 16. The conductor pattern 16A is connected, at its one end, to one end of the conductor pattern 15A through the via conductor 15C formed on the base-material layer 15 and, further, is connected, at its other end, to the conductor pattern 15B as the mounting electrode through the via conductor 15D.

As described above, the via conductors 15C and 15D and the conductor pattern 16A connect the conductor pattern 15B to one end of the coil 1A. These via conductors 15C and 15D and the conductor pattern 16A are an example of "the conductor line path".

In the inductor device 1 provided in the aforementioned manner, the portion of the layer-laminated member 10 in which all the base-material layers 11 to 14 and the base-material layers 15 and 16 overlap with each other (the portion including the six layers, for example) is referred to as a greater-thickness portion 10A. Further, the portion of the layer-laminated member 10 in which only the base-material layers 15 and 16 overlap with each other (the portion having the two layers) is referred to as a smaller-thickness portion 10B. Namely, the smaller-thickness portion 10B is located near one end portion of the layer-laminated member 10 in the direction of layer lamination. Further, the coil 1A is located in the greater-thickness portion 10A. The conductor pattern 15B is located in the smaller-thickness portion 10B.

The inductor device 1 is mounted on a substrate, using the conductor patterns 11A and 15B as the mounting electrodes. In the present preferred embodiment, a connector 100 is connected to the conductor pattern 15B. Further, in the inductor device 1, the conductor pattern 11A is connected to the substrate through soldering, and the conductor pattern 15B is connected to the substrate through the connector 100.

The conductor patterns 11A and 15B, which are the mounting electrodes in the inductor device 1, are located near the respective end portions of the layer-laminated member 10 in the direction of layer lamination. Namely, the via conductor 15C, the conductor pattern 16A and the via conductor 15D which are derived from one end of the coil 1A in the direction of layer lamination, and the via conductor 11B derived from the other end of the coil 1A are not provided in the base-material layers 12 to 14. If the via conductors 11B, 15C, 15D and the conductor pattern 16A are located near the coil 1A in the direction of layer lamination, eddy currents will occur in the via conductors 11B, 15C, 15D and the conductor pattern 16A due to magnetic fields generated from the coil 1A, thus generating electric power losses.

Further, if the via conductors 11B, 15C, 15D and the conductor pattern 16A are located along the coil 1A, unnecessary capacitances will be generated between the via conductors 11B, 15C, 15D and the conductor pattern 16A, and the coil 1A. However, since the via conductors 11B, 15C, 15D and the conductor pattern 16A do not exist near (outside) the coil 1A, no unnecessary capacitance will be generated outside the coil 1A. This significantly reduces or prevents fluctuations of the coil characteristics.

Further, the mounting surfaces, on which the conductor pattern 11A and the conductor pattern 15B as the mounting electrodes in the inductor device 1 are provided, are perpendicular or substantially perpendicular to the direction of layer lamination in the layer-laminated member 10 and, further, are at different positions in the planar direction and in the heightwise direction (the direction of layer lamination in the layer-laminated member 10). Therefore, the inductor device 1 is able to be mounted on a substrate including a level difference.

Figure 2:
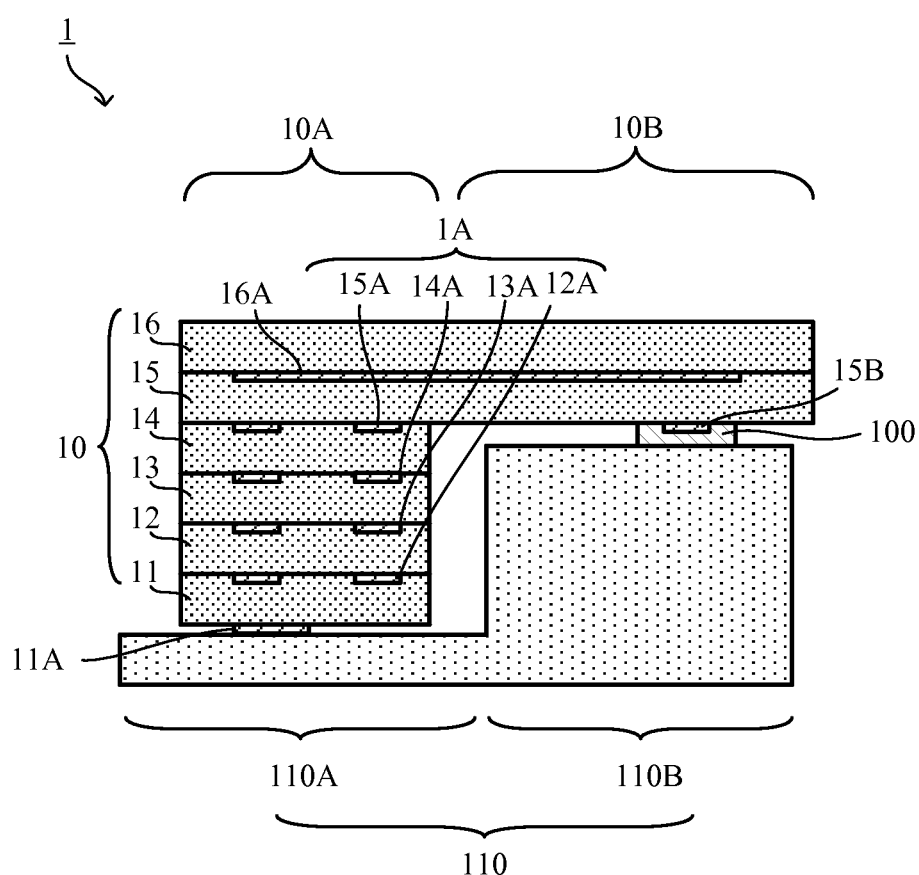
FIG. 2 is a view illustrating a state where the inductor device is mounted on a substrate including a level difference.

FIG. 2 is a view illustrating a state where the inductor device 1 is mounted on a substrate including a level difference. Further, in FIG. 2, there is illustrated a cross section of the inductor device 1.

The substrate 110 preferably includes a flat-plate portion 110A and a level-difference portion 110B which have different heights. Further, the flat-plate portion 110A and the level-difference portion 110B are provided with respective mounting electrodes to mount the inductor device 1.

As described above, the mounting electrodes in the inductor device 1 are constituted by the conductor patterns 11A and 15B. Further, the conductor pattern 15B is located at a higher position than that of the conductor pattern 11A. Therefore, when the inductor device 1 is mounted on the substrate 110, the conductor pattern 11A in the inductor device 1 is mounted to the mounting electrode in the flat plate portion 110A, while the conductor pattern 15B is mounted to the mounting electrode in the level-difference portion 110B with the connector 100 interposed therebetween. Thus, the inductor device 1 is mounted on the substrate 110 in such a way as to straddle the level difference. Even when the inductor device 1 is mounted on the substrate 110 including the level difference as described above, it can be mounted thereon without deforming the portion provided with the coil 1A.

In the inductor device 1 according to the present preferred embodiment, the conductor pattern 11A and the conductor pattern 15B, which are connected to the opposite ends of the coil 1A, are located near the respective opposite end portions of the layer-laminated member 10 in the direction of layer lamination. Further, the via conductors 15C and 15D and the conductor pattern 16A which connect the conductor pattern 15B to one end of the coil 1A, and the via conductor 11B which connects the conductor pattern 11A to the other end of the coil 1A are not located along the winding axis of the coil 1A near sides of the coil 1A. This significantly reduces or prevents the occurrence of eddy currents in the via conductors 11B, 15C and 15D and the conductor pattern 16A due to magnetic fields generated from the coil 1A. This results in reduction or prevention of electric power losses.

Further, in the present preferred embodiment, the inductor device 1 is mounted on the substrate 110 with the connector 100 interposed therebetween. When it is mounted on the substrate 110 having the level difference, one of the mounting electrodes is mounted thereon through the connector 100 in advance, which makes it easier to solder the other mounting electrode (the conductor pattern 11A). Particularly, since the base-material layers 11 to 16 have flexibility, it is possible to prevent damage of the inductor device 1, when the connector 100 is connected to the substrate 110. This makes it easier to perform the connection operation. Also, it is possible to directly solder the conductor pattern 15B to the substrate, without providing the connector 100.

Further, the mounting surfaces in the inductor device 1, on which the conductor patterns 11A and 15B are provided, are such that the directions of lines normal thereto are coincident with the direction of layer lamination in the layer-laminated member 10. Therefore, when the inductor device 1 is mounted on the substrate 110, the direction of layer lamination in the layer-laminated member 10 is coincident with the directions of lines normal to the mounting surfaces in the substrate 110. Accordingly, even when the inductor device 1 is mounted on the substrate 110, the coil 1A is prevented from deforming, since the coil 1A has a coil winding axis coincident with the direction of layer lamination in the layer-laminated member 10. This significantly reduces or prevents the risk of fluctuations of the coil characteristics.

The inductor device 1 is preferably fabricated through various non-limiting processes as follows.

A copper foil is attached to a resin sheet at one of its main surfaces, or a single-surface copper-attached sheet is prepared. Further, patterning is performed on a resist film on the copper foil, according to the conductor pattern to be formed thereon. Etching is performed thereon to form the conductor pattern, and the resist film is removed. For each of the base-material layers 11 to 15, laser light is directed to the other surface (the surface to which the copper foil is not attached) of the resin sheet, at each position (each position at which the copper foil has been removed by the aforementioned etching) to form a hole. Further, a conductive paste is charged into the hole (the via hole). In this way, each of the base-material layers 11 to 16 can be formed.

Next, the base-material layers 11 to 16 are stacked in order. At this time, for example, the base-material layer 12, which is to be stacked on the base-material layer 11, is stacked on the main surface on which the conductor pattern 11A has not been formed, in the base-material layer 11, such that its main surface on which the conductor pattern 12A has been formed is closer to the base-material layer 11. Further, positioning thereof is performed, in consideration of the positional relationship between the via conductor 11B formed in the base-material layer 11 and the conductor pattern 12A.

Heating and pressurizing processing are performed on the base-material layers 11 to 16 which have been stacked, in order to bond them to each other. The resin sheets have thermoplasticity as described above and, therefore, it is not necessary to use an adhesive agent. Further, during the heating and pressurizing processing, the via conductors are bonded to the corresponding conductors. In this way, the inductor device 1 is able to be fabricated through the simple processes.

Further, while, in the present preferred embodiment, the base-material layers 11 to 16 are all preferably formed from a thermoplastic resin having flexibility, the inductor device 1 is required only to have flexibility at least at the smaller-thickness portion 10B. Provided that the smaller-thickness portion 10B has flexibility, it is possible to easily perform the connection operation utilizing the flexibility of the smaller-thickness portion 10B, in connecting the connector 100 which has been connected to the conductor pattern 15B, to a substrate and the like.

Figure 3:
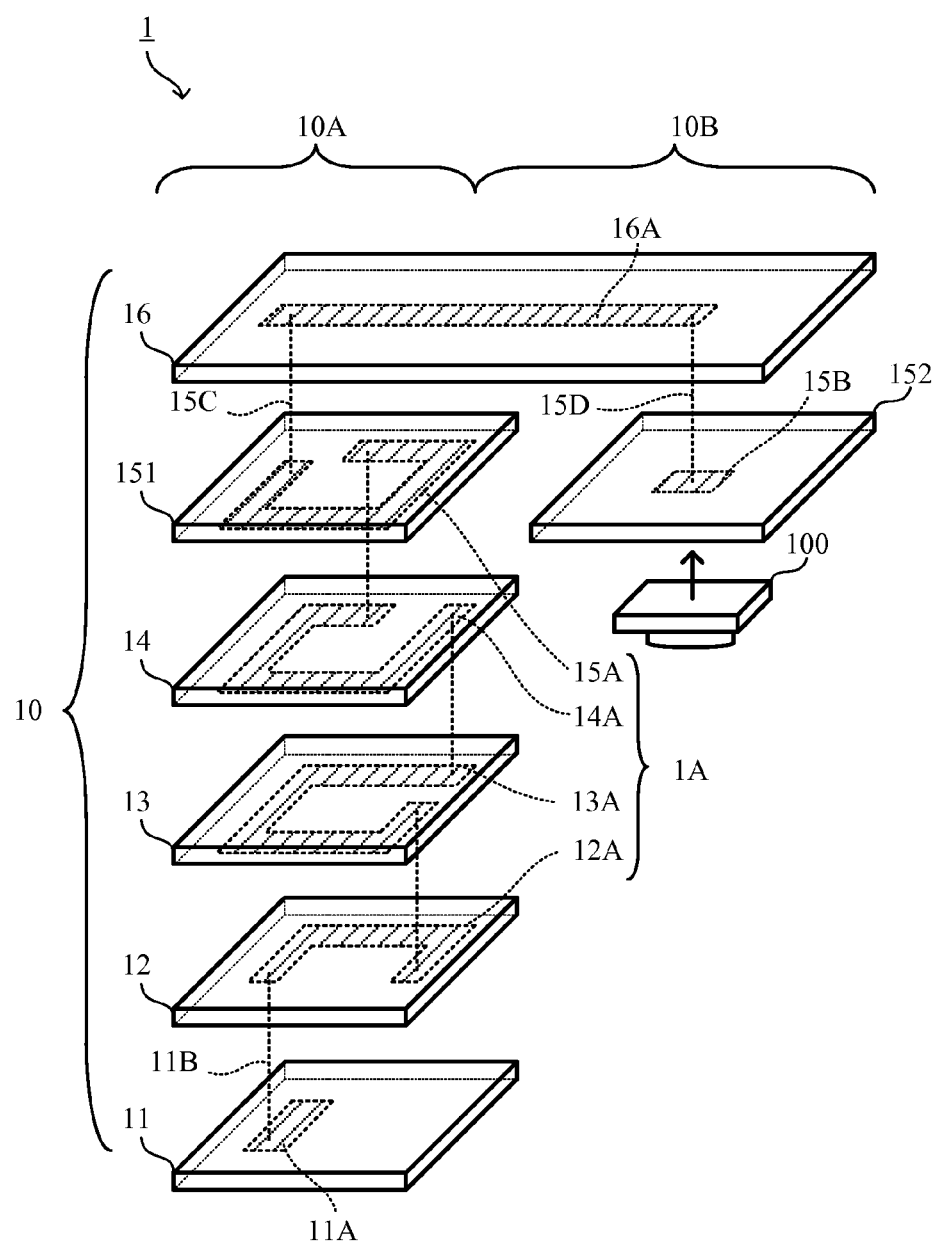
FIG. 3 is a view illustrating an example of modification of the inductor device according to the first preferred embodiment of the present invention.

Further, while the conductor patterns 15A and 15B are formed on the single base-material layer 15, the base-material layer 15 can be also divided into the respective portions provided with the conductor patterns 15A and 15B. FIG. 3 is a view illustrating an example of modification of the inductor device according to the first preferred embodiment. In this example, a base-material layer 151 having the same size and the same shape as those of the base-material layers 11 to 14 is laminated on the base-material layer 14. A conductor pattern 15A is formed on one main surface (a lower surface in FIG. 3) of the base-material layer 151. Further, in the base-material layer 151, a via conductor 15C is provided to connect the conductor pattern 15A to one end of the conductor pattern 16A. Further, a base-material layer 152 is laminated on the base-material layer 16, at a position which is closer to the base-material layer 14 (in a lower side in FIG. 3) and overlaps with the other end of the conductor pattern 16A in a plan view. A conductor pattern 15B is formed on one main surface (a lower surface in FIG. 3) of the base-material layer 152. Further, in the base-material layer 152, a via conductor 15D is provided to connect the conductor pattern 15B to the other end of the conductor pattern 16A. The inductor device 1 is also able to be structured as described above.

In the example illustrated in FIG. 3, the portion of the layer-laminated member 10 in which all the base-material layers 11, 12, 13, 14 and 15 and the base-material layer 16 overlap with each other (the portion having the six layers) is a greater-thickness portion 10A. Further, the portion of the layer-laminated member 10 in which there is only the base-material layer 16 (the portion having the single layer) and the portion in which the base-material layer 16 and the base-material layer 152 overlap with each other (the portion having the two layers) define a smaller-thickness portion 10B. Namely, the smaller-thickness portion 10B is located near one end portion of the layer-laminated member 10 in the direction of layer lamination. Further, the coil 1A is provided in the greater-thickness portion 10A. The conductor pattern 15B which is an example of "the first terminal portion" is provided in the smaller-thickness portion 10B.

Second Preferred Embodiment

Hereinafter, an inductor device according to a second preferred embodiment of the present invention will be described. The inductor device according to the present preferred embodiment is different from that in the first preferred embodiment, in that two mounting electrodes in the inductor device are adapted such that they do not overlap with a coil in a plan view. Since the mounting electrodes do not overlap with the coil, it is possible to significantly reduce or prevent the occurrence of stray capacitances therebetween.

Figure 4:
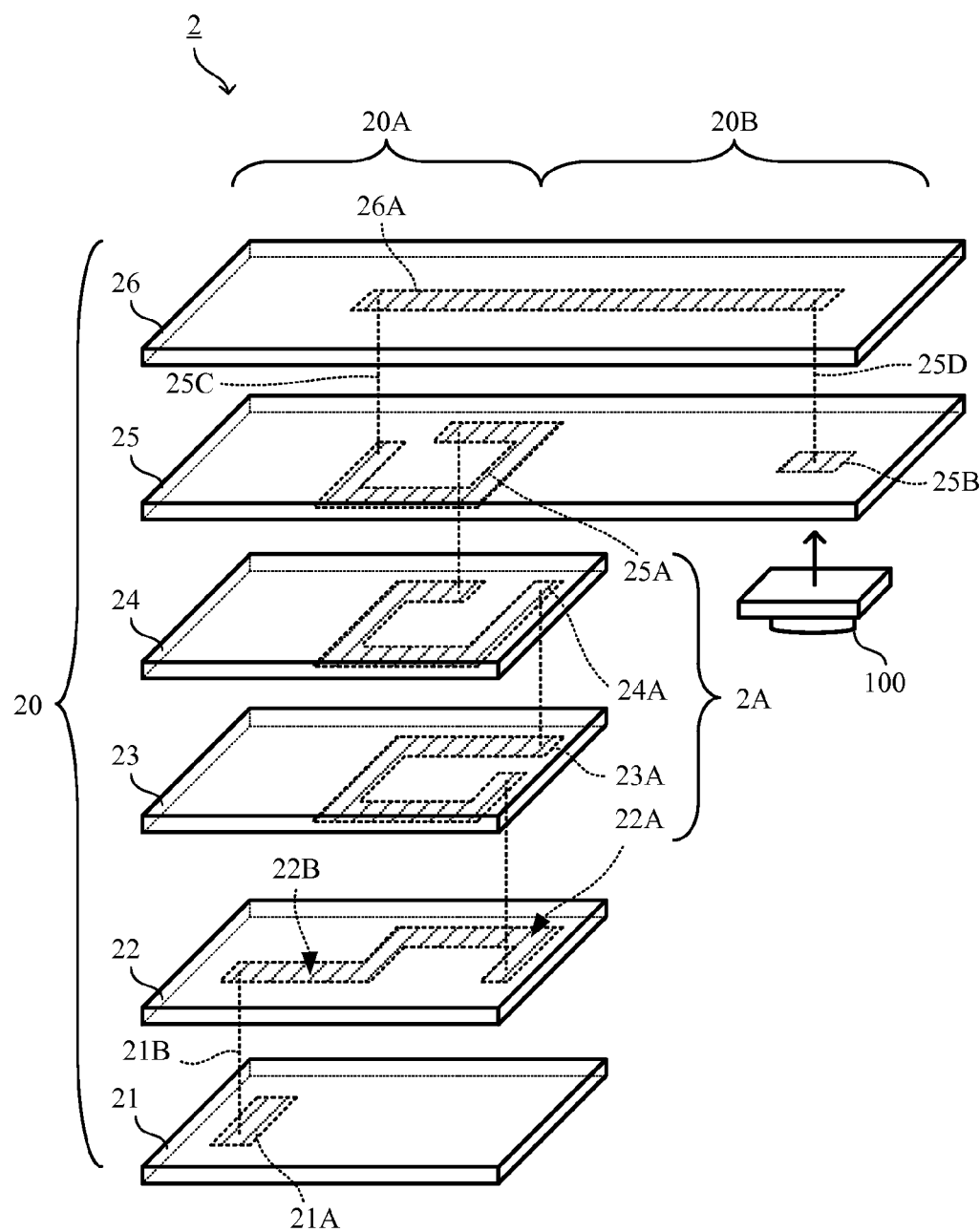
FIG. 4 is an exploded perspective view of an inductor device according to a second preferred embodiment of the present invention.
Figure 5:
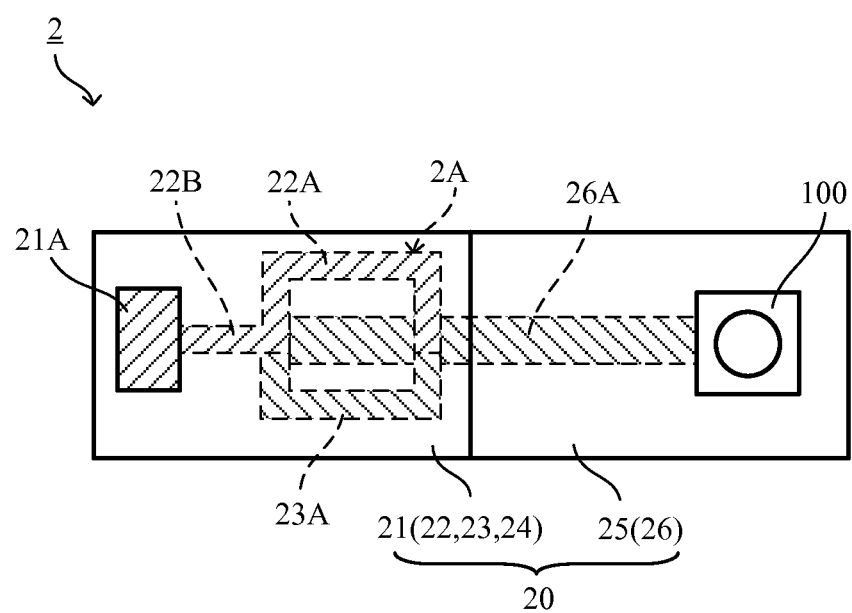
FIG. 5 is a plan view illustrating the inductor device according to the second preferred embodiment of the present invention viewed from a mounting surface.

FIG. 4 is an exploded perspective view of the inductor device according to the second preferred embodiment. FIG. 5 is a plan view illustrating the inductor device according to the second preferred embodiment viewed from the side of a mounting surface. FIGS. 4 and 5 illustrate views of the same in a partially-transparent manner.

An inductor device 2 includes a layer-laminated member provided with a coil 2A. The layer-laminated member 20 includes base-material layers 21, 22, 23, 24, 25 and 26 made of a thermoplastic resin having flexibility, such as an LCP resin (liquid crystal polymer resin), which have been thermally pressed.

The base-material layer 21 preferably has a rectangular or substantially rectangular shape having shorter sides and longer sides. On one main surface (a lower surface in FIG. 4) of the base-material layer 21, there is provided a conductor pattern 21A with a rectangular or substantially rectangular shape. The base-material layer 21 is an outermost layer in the layer-laminated member 20, and the inductor device is mounted on a substrate, using the main surface provided with the conductor pattern 21A in the base-material layer 21, as a mounting surface. Accordingly, the conductor pattern 21A is used as a mounting electrode in the inductor device 2. The conductor pattern 21A is an example of "the second terminal portion".

Further, in the base-material layer 21, there is provided a via conductor 21B at a position which overlaps with the conductor pattern 21A in a plan view.

The base-material layer 22 has the same or substantially the same size and the same shape as those of the base-material layer 21. On one main surface (a lower surface in FIG. 4) thereof, there are provided conductor patterns 22A and 22B. The conductor pattern 22A has a band shape and is wound in such a way as to define an interior space. The conductor pattern 22A is located near one end portion of the base-material layer 22 in the longitudinal direction. The conductor pattern 22B is derived from one end of the conductor pattern 22A and extends in the longitudinal direction of the base-material layer 22.

The base-material layer 22 is laminated on the base-material layer 21, such that the one main surface thereof which is provided with the conductor patterns 22A and 22B is closer to the base-material layer 21 and, also, one end of the conductor pattern 22B overlaps with the conductor pattern 21A. The conductor pattern 22B is connected, at its one end, to the conductor pattern 21A, through the via conductor 21B provided in the base-material layer 21. The conductor pattern 22A defines a portion (an outermost portion) of the coil 2A, and the via conductor 21B and the conductor pattern 22B connect the conductor pattern 21A to one end of the conductor pattern 22A, namely the other end of the coil 2A. The via conductor 21B and the conductor pattern 22B are an example of "the conductor line path".

The base-material layer 23 has the same or substantially the same size and the same shape as those of the base-material layers 21 and 22. On one main surface (a lower surface in FIG. 4) thereof, there is provided a conductor pattern 23A. The conductor pattern 23A has a band shape and is wound in such a way as to define an interior space. The conductor pattern 23A is located near one end portion of the base-material layer 23 in the longitudinal direction. The base-material layer 23 is laminated on the base-material layer 22, such that the one main surface thereof which is provided with the conductor pattern 23A is closer to the base-material layer 22. The conductor pattern 23A overlaps with the conductor pattern 22A in a plan view, when the base-material layer 23 is laminated on the base-material layer 22. Further, the conductor pattern 23A is connected, at its one end, to one end of the conductor pattern 22A, through a via conductor in the base-material layer 22.

The base-material layer 24 has the same or substantially the same size and the same shape as those of the base-material layers 21 to 23. On one main surface (a lower surface in FIG. 4) thereof, there is provided a conductor pattern 24A. The conductor pattern 24A has a band shape and is wound in such a way as to define an interior space. The conductor pattern 24A is located near one end portion of the base-material layer 24 in the longitudinal direction. The base-material layer 24 is laminated on the base-material layer 23, such that the one main surface thereof which is provided with the conductor pattern 24A is closer to the base-material layer 23. The conductor pattern 24A overlaps with the conductor patterns 22A and 23A in a plan view, when the base-material layer 24 is laminated on the base-material layer 23. Further, the conductor pattern 24A is connected, at its one end, to one end of the conductor pattern 23A, through a via conductor in the base-material layer 23.

The base-material layer 25 has a rectangular or substantially rectangular shape having shorter sides with the same length as that of the shorter sides of the base-material layers 21 to 24, and longer sides with a greater length than that of the longer sides of the base-material layers 21 to 24. On one main surface (a lower surface in FIG. 4) of the base-material layer 25, there are provided conductor patterns 25A and 25B. The conductor pattern 25A is located near one end portion of the base-material layer 25 in the longitudinal direction, and the conductor pattern 25B is located near the other end portion thereof. The base-material layer 25 is laminated on the base-material layer 24, such that the one main surface thereof which is provided with the conductor patterns 25A and 25B is closer to the base-material layer 24.

The base-material layer 25 has a greater length in the longitudinal direction than that of a side of the base-material layer 24. Therefore, in the case where the base-material layer 25 is laminated on the base-material layer 24, the base-material layer 25 includes a portion overlapping with the base-material layers 21 to 24, and a portion not overlapping therewith, in a plan view. The conductor pattern 25A is provided in the portion of the base-material layer 25 which overlaps with the base-material layers 21 to 24, in such a way as to overlap with the conductor patterns 22A to 24A in a plan view. The conductor pattern 25A has a band shape and is wound in such a way as to define an interior space. The conductor pattern 25A is connected, at its one end, to one end of the conductor pattern 24A through a via conductor in the base-material layer 24.

These conductor patterns 22A, 23A, 24A and 25A are connected to each other through the via conductors to define the coil 2A.

The conductor pattern 25B is provided on the portion which is not overlapping with the base-material layers 21 to 24, in the base-material layer 25. Accordingly, the conductor pattern 25B is provided on the portion which is not overlapping with the coil 2A in a plan view. The portion of the base-material layer 25 which is not overlapping with the base-material layers 21 to 24 and is provided with the conductor pattern 25B defines a mounting surface of the inductor device 2. Accordingly, the conductor pattern 25B is preferably used as a mounting electrode in the inductor device 1. The conductor pattern 25B is an example of "a first terminal portion".

Further, in the base material layer 25, there are provided via conductors 25C and 25D. The via conductor 25C overlaps with the conductor pattern 25A in a plan view, and the via conductor 25D is located at a position overlapping with the conductor pattern 25B in a plan view.

The base-material layer 26 has the same or substantially the same size and the same shape as those of the base-material layer 25. On one main surface (a lower surface in FIG. 4) thereof, there is provided a conductor pattern 26A. The base-material layer 26 is laminated on the base-material layer 25, such that the main surface thereof which is provided with the conductor pattern 26A is closer to the base-material layer 25. The conductor pattern 26A has a band shape extending in the longitudinal direction of the base-material layer 26. The conductor pattern 26A is connected, at its one end, to one end of the conductor pattern 25A through the via conductor 25C in the base-material layer 25 and, further, is connected, at its other end, to the conductor pattern 25B as the mounting electrode through the via conductor 25D.

As described above, the via conductors 25C and 25D and the conductor pattern 26A connect the conductor pattern 25B to one end of the coil 2A. These via conductors 25C and 25D and the conductor pattern 26A are an example of "the conductor line path".

In the inductor device 2 configured in the aforementioned manner, the portion of the layer-laminated member 20 in which all the base-material layers 21 to 24 and the base-material layers 25 and 26 overlap with each other (the portion having the six layers) is referred to as a greater-thickness portion 20A. Further, the portion of the layer-laminated member 20 in which only the base-material layers 25 and 26 overlap with each other (the portion having the two layers) is referred to as a smaller-thickness portion 20B. Namely, the smaller-thickness portion 20B is located near one end portion of the layer-laminated member 20 in the direction of layer lamination. Further, the coil 2A is located in the greater-thickness portion 20A. The conductor pattern 25B is located in the smaller-thickness portion 20B.

The inductor device 2 is mounted on a substrate, using the conductor patterns 21A and 25B as the mounting electrodes. In the present preferred embodiment, a connector 100 is mounted to the conductor pattern 25B. Further, in the inductor device 2, the conductor pattern 21A is mounted on the substrate through soldering, and the conductor pattern 25B is connected to the substrate through the connector 100.

The conductor patterns 21A and 25B, which are the mounting electrodes in the inductor device 2, are located near the respective opposite end portions of the layer-laminated member 20 in the direction of layer lamination. Namely, the via conductor 21B derived from one end of the coil 2A in the direction of layer lamination, and the via conductor 25C, the conductor pattern 26A and the via conductor 25D which are derived from the other end of the coil 2A are not located near the coil 2A along the direction of layer lamination. This significantly reduces or prevents the occurrence of electric power losses due to magnetic fields generated from the coil 2A, similarly to the first preferred embodiment. Further, as illustrated in FIG. 5, the conductor patterns 21A and 25B do not overlap with the coil 2A in a plan view, which significantly reduces or prevents the occurrence of stray capacitances between the conductor patterns 21A and 25B and the coil 2A. This significantly reduces or prevents the risk of fluctuations of the characteristics of the coil 2A due to occurrences of such stray capacitances.

Further, since the conductor patterns 21A and 25B defining the mounting electrodes are at different positions in the direction of layer lamination, the inductor device 2 is able to be mounted on a substrate including a level difference, as described with reference to FIG. 2. Further, since the base-material layers 21 to 26 have flexibility, it is possible to significantly reduce or prevent the risk of damage of the base-material layers 21 to 26, when the conductor pattern 21A is soldered to the substrate and the connector 100 mounted to the conductor pattern 25B is connected to the substrate. Further, even when the inductor device 2 is mounted on such a substrate including a level difference, the coil 2A is prevented from deforming, which significantly reduces or prevents the risk of fluctuations of the coil characteristics.

Further, while, in the present preferred embodiment, the base-material layers 21 to 26 preferably are all formed from a thermoplastic resin having flexibility, the inductor device 2 is required only to have flexibility at least at the smaller-thickness portion 20B. Provided that the smaller-thickness portion 20B has flexibility, it is possible to easily perform the connection operation utilizing the flexibility of the smaller-thickness portion 20B, in connecting the connector 100 which has been connected to the conductor pattern 25B, to a substrate and the like.

Third Preferred Embodiment

Hereinafter, an inductor device according to the third preferred embodiment of the present invention will be described. The inductor device according to the present preferred embodiment is formed preferably by reducing the size of the layer-laminated member in the inductor device according to the second preferred embodiment. Further, while, in the inductor devices according to the first and second preferred embodiments, one of the two mounting electrodes is connected to a substrate through soldering and the other one of them is connected to the substrate through a connector, both of the two mounting electrodes are connected to a substrate through connectors in the inductor device according to the present preferred embodiment. Hereinafter, the differences thereof from the second preferred embodiment will be described.

Figure 6:
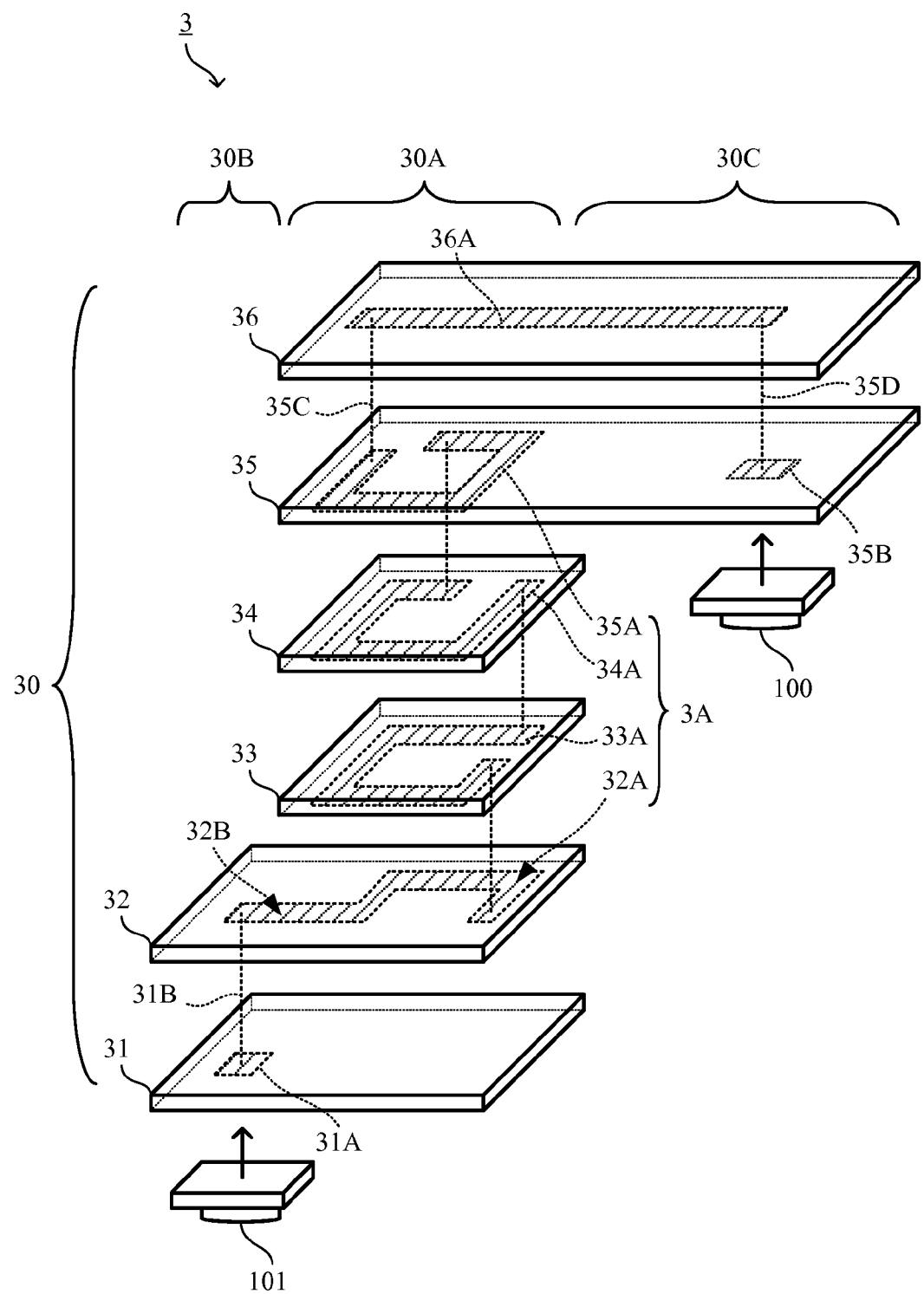
FIG. 6 is an exploded perspective view of an inductor device according to a third preferred embodiment of the present invention.

FIG. 6 is an exploded perspective view of the inductor device according to the third preferred embodiment. FIG. 6 illustrates a view of the same in a partially-transparent manner.

An inductor device 3 includes a layer-laminated member provided with a coil 3A. The layer-laminated member 30 includes base-material layers 31, 32, 33, 34, 35 and 36 made of a thermoplastic resin having flexibility, such as an LCP resin, which have been thermally pressed.

The base-material layers 31 and 32 are the same as the base-material layers 21 and 22 described in the second preferred embodiment. Further, conductor patterns 31A, 32A and 32B each of which is provided on one main surface (lower surfaces in FIG. 6) of each of the base-material layers 31 and 32, respectively and a via conductor 31B provided in the base-material layer 31 are the same as the conductor patterns 21A, 22A and 22B and the via conductor 21B which have been described in the second preferred embodiment. In the present preferred embodiment, a connector 101 is provided on the conductor pattern 31A. Further, the conductor pattern 31A is an example of "the second terminal portion". The via conductor 31B and the conductor pattern 32B are an example of "the conductor line path".

The base-material layer 33 preferably has a square or substantially-square shape, such that each side thereof has the same or substantially the same length as that of the shorter sides of the base-material layers 31 and 32. On one main surface (a lower surface in FIG. 6) of the base-material layer 33, there is provided a conductor pattern 33A. The conductor pattern 33A has a band shape and is wound in such a way as to define an interior space. The base-material layer 33 is laminated on the base-material layer 32, such that the main surface thereof which is provided with the conductor pattern 33A is closer to the base-material layer 32 and, also, the conductor pattern 33A overlaps with the conductor pattern 32A. The conductor pattern 33A overlaps with the conductor pattern 32A in a plan view, when the base-material layer 33 is laminated on the base-material layer 32. The conductor pattern 33A is connected, at its one end, to one end of the conductor pattern 32A, through a via conductor in the base-material layer 32.

Further, the base-material layers 31 and 32 have longer sides which are longer than a side of the base-material layer 33. Therefore, in the case where the base-material layer 33 is laminated on the base-material layers 31 and 32 such that the base-material layer 33 is aligned with one end portions of the base-material layers 31 and 32, the base-material layers 31 and 32 include a portion overlapping with the base-material layer 33, and a portion not overlapping therewith, in a plan view. The one end of the conductor pattern 32B in the opposite side from the conductor pattern 32A is positioned on the portion of the base-material layer 32 which does not overlap with the base-material layer 33. Accordingly, no base-material layer exists just above the conductor pattern 31A as a mounting electrode, along the direction of layer lamination.

The base-material layer 34 has the same or substantially the same size and the same shape as those of the base-material layer 33. On one main surface (a lower surface in FIG. 6) thereof, a conductor pattern 34A is provided. The base-material layer 34 is laminated on the base-material layer 33, such that this one main surface is closer to the base-material layer 33. The conductor pattern 34A has a band shape and is wound in such a way as to define an interior space. The conductor pattern 34A overlaps with the conductor pattern 33A in a plan view, when the base-material layer 34 is laminated on the base-material layer 33. The conductor pattern 34A is connected, at its one end, to one end of the conductor pattern 33A, through a via conductor in the base-material layer 33.

The base-material layer 35 has a rectangular or substantially rectangular shape having shorter sides with the same length as that of a side of the base-material layers 33 and 34, and longer sides with a greater length than that of the shorter sides thereof. On one main surface (a lower surface in FIG. 6) of the base-material layer 35, conductor patterns 35A and 35B are provided. The conductor pattern 35A is located near one end portion of the base-material layer 35 in the longitudinal direction, while the conductor pattern 35B is located near the other end portion thereof. The base-material layer 35 is laminated on the base-material layer 34, such that the one main surface thereof which is provided with the conductor patterns 35A and 35B is closer to the base-material layer 34 and, also, the conductor pattern 35A faces the conductor pattern 34A.

The base-material layer 35 has a greater length in the longitudinal direction than that of a side of the base-material layers 33 and 34. Therefore, in the case where the base-material layer 35 is laminated on the base-material layer 34, the base-material layer 35 includes a portion overlapping with the base-material layers 33 and 34, and a portion not overlapping therewith, in a plan view. The conductor pattern 35A is provided in the portion of the base-material layer 35 which overlaps with the base-material layers 33 and 34, in such a way as to overlap with the conductor patterns 32A to 34A in a plan view. The conductor pattern 35A has a band shape and is wound in such a way as to define an interior space. The conductor pattern 35A is connected, at its one end, to one end of the conductor pattern 34A through a via conductor in the base-material layer 34.

These conductor patterns 32A, 33A, 34A and 35A are connected to each other through the via conductors to define the coil 3A.

The conductor pattern 35B has a rectangular or substantially rectangular shape and is provided on the portion which does not overlap with the base-material layers 33 and 34. Accordingly, the conductor patterns 35B is located in the portion which does not overlap with the coil 3A in a plan view. The portion of the base-material layer 35 which does not overlap with the base-material layers 33 and 34 and is provided with the conductor pattern 35B defines a mounting surface of the inductor device 3. Accordingly, the conductor pattern 35B is preferably used as a mounting electrode in the inductor device 3. The conductor pattern 35B is an example of "the first terminal portion".

Further, in the base material layer 35, via conductors 35C and 35D are provided. The via conductor 35C overlaps with the conductor pattern 35A in a plan view, and the via conductor 35D overlaps with the conductor pattern 35B in a plan view.

The base-material layer 36 has the same or substantially the same size and the same shape as those of the base-material layer 35. On one main surface (a lower surface in FIG. 6) thereof, a conductor pattern 36A is provided. The base-material layer 36 is laminated on the base-material layer 35, such that this one main surface is closer to the base-material layer 35. The conductor pattern 36A has a band shape extending in the longitudinal direction of the base-material layer 36. The conductor pattern 36A is connected, at its one end, to one end of the conductor pattern 35A through the via conductor 35C located in the base-material layer 35 and, further, is connected, at its other end, to the conductor pattern 35B defining the mounting electrode through the via conductor 35D.

As described above, the via conductors 35C and 35D and the conductor pattern 36A connect the conductor pattern 35B to one end of the coil 3A. These via conductors 35C and 35D and the conductor pattern 36A are an example of "the conductor line path".

In the inductor device 3 configured as described above, the portion of the layer-laminated member 30 in which all the base-material layers 31 to 36 overlap with each other (the portion having the six layers) is referred to as a greater-thickness portion 30A. Further, the portion of the layer-laminated member 30 in which only the base-material layers 31 and 32 overlap with each other (the portion having the two layers) is referred to as a smaller-thickness portion 30B, and the portion thereof in which only the base-material layers 35 and 36 overlap with each other (the portion having the two layers) is referred to as a smaller-thickness portion 30C. Namely, the smaller-thickness portions 30B and 30C are located in the respective opposite end portions of the layer-laminated member 30 in the direction of layer lamination. Further, the coil 3A is located in the greater-thickness portion 30A. The conductor patterns 31A and 35B are located in the smaller-thickness portions 30B and 30C.

The inductor device 3 is mounted on a substrate, using the conductor patterns 31A and 35B as the mounting electrodes. In the present preferred embodiment, connectors 101 and 100 are mounted to the conductor patterns 31A and 35B. Further, the inductor device 3 is connected to the substrate through the connectors 101 and 100. Since the inductor device 3 is able to be connected to the substrate through the connectors 101 and 100, it is not necessary to perform soldering, which makes it easier to perform the connection operation.

Further, the conductor patterns 31A and 35B, which are the mounting electrodes in the inductor device 3, are located near the respective opposite end portions of the layer-laminated member 30 in the direction of layer lamination. Namely, the via conductor 35C, the conductor pattern 36A and the via conductor 35D which are derived from one end of the coil 3A in the direction of layer lamination, and the via conductor 31B and the conductor pattern 32B which are derived from the other end of the coil 3A are not located near the coil 3A along the direction of layer lamination. This significantly reduces or prevents the occurrence of electric power losses due to magnetic fields generated from the coil 3A, similarly to the first and second preferred embodiments. Further, the conductor patterns 31A and 35B do not overlap with the coil 3A in a plan view, which significantly reduces or prevents the occurrence of stray capacitances between the conductor patterns 31A and 35B and the coil 3A. This significantly reduces or prevents the risk of fluctuations of the characteristics of the coil 3A, due to the occurrence of such stray capacitances.

Further, the inductor device 3 is able to be mounted on a substrate including a level difference, similarly to the first and second preferred embodiments.

In the inductor device 3, no base-material layer exists in the area facing the conductor pattern 31A, unlike in the second preferred embodiment. In other words, the base-material layers 33 to 36 have smaller sizes than those of the base-material layers 23 to 26 in the second preferred embodiment. Therefore, the layer-laminated member 30 is smaller than the layer-laminated member 20 in the second preferred embodiment, which results in reduction of the size of the inductor device 3, thus enabling reduction of the space for the area in which the inductor device 3 is mounted.

Fourth Preferred Embodiment

Hereinafter, an inductor device according to the fourth preferred embodiment of the present invention will be described. The inductor device according to the present preferred embodiment is formed preferably by reducing the number of the layers laminated in the layer-laminated member in the inductor device according to the third preferred embodiment. Hereinafter, the differences thereof from the third preferred embodiment will be described.

Figure 7:
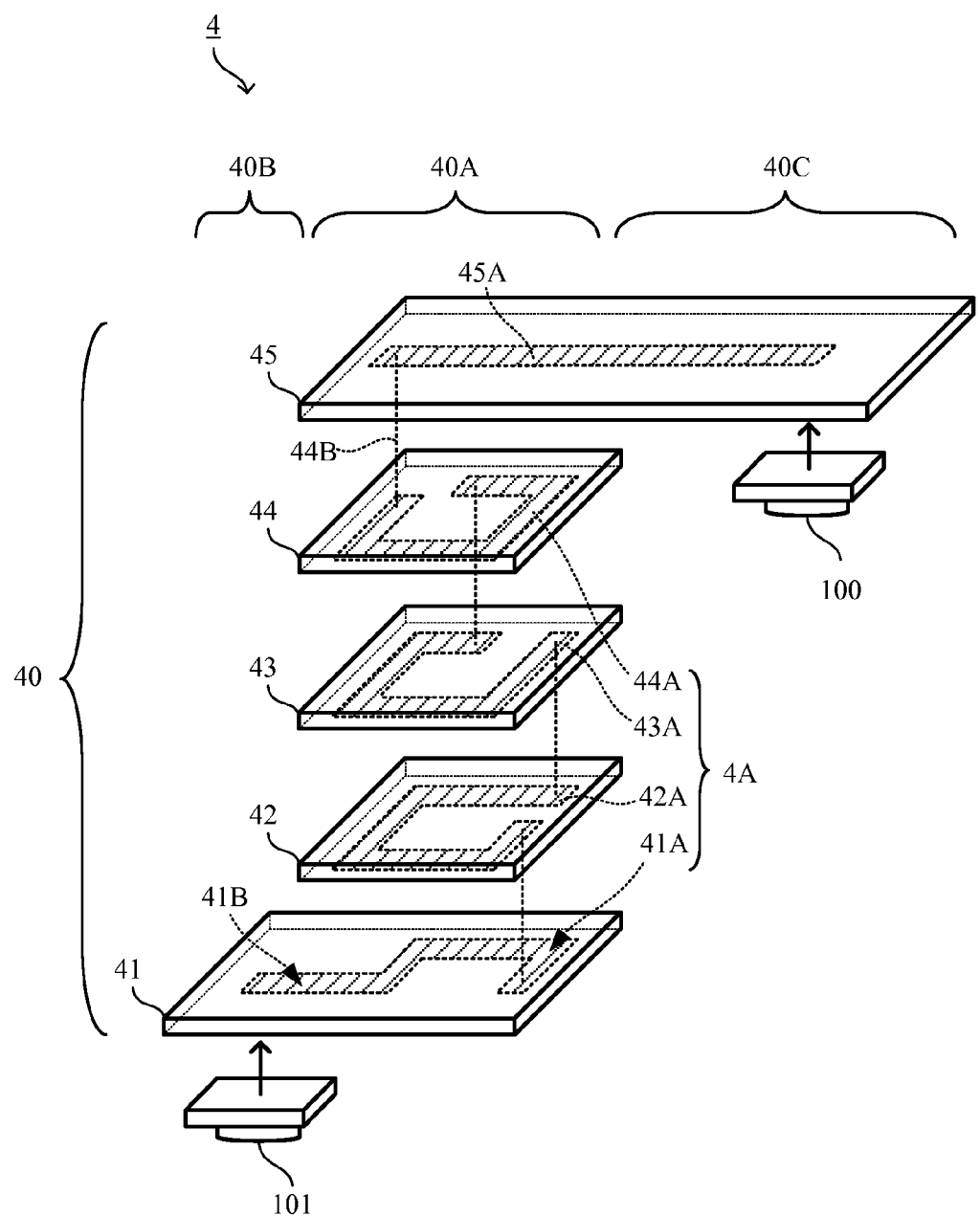
FIG. 7 is an exploded perspective view of an inductor device according to a fourth preferred embodiment of the present invention.

FIG. 7 is an exploded perspective view of the inductor device according to the fourth preferred embodiment. FIG. 7 illustrates a view of the same in a partially-transparent manner.

An inductor device 4 includes a layer-laminated member provided with a coil 4A. The layer-laminated member 40 includes base-material layers 41, 42, 43, 44 and 45 made of a thermoplastic resin having flexibility, such as an LCP resin, which have been thermally pressed.

The base-material layers 41, 42 and 43 are the same as the base-material layers 32, 33 and 34 according to the third preferred embodiment. Further, conductor patterns 41A, 41B, 42A and 43A each of which is provided on one main surface of each of the base-material layers 41, 42 and 43, respectively, are the same as the conductor patterns 31A, 32A, 32B and 33A each of which is provided on one main surfaces of each of the base-material layers 32, 33 and 34, respectively.

In the present preferred embodiment, the conductor patterns 41A and 41B provided on the one main surface (the lower surface in FIG. 7) of the base-material layer 41 are exposed, and a resist is provided on the conductor pattern 41A, and on the portion of the conductor pattern 41B other than a portion thereof. The portion of the conductor pattern 41B on which the resist is not provided is exposed, and a connector 101 is provided on this portion. This one end portion of the conductor pattern 41B which is exposed is an example of "the second terminal portion". Further, the via conductor 41B is an example of "the conductor line path".

The base-material layer 44 has a square or substantially-square shape having the same or substantially the same size as that of the base-material layers 42 and 43. On one main surface (a lower surface in FIG. 7) thereof, a conductor pattern 44A is provided. The base-material layer 44 is laminated on the base-material layer 43, such that this one main surface is closer to the base-material layer 43. The conductor pattern 44A has a band shape and is wound in such a way as to define an interior space. The conductor pattern 44A is connected, at its one end, to one end of the conductor pattern 43A, through a via conductor in the base-material layer 43.

These conductor patterns 41A, 42A, 43A, and 44A are connected to each other through the via conductors to define the coil 4A.

Further, in the base-material layer 44, there is provided a via conductor 44B at a position which overlaps with the conductor pattern 44A in a plan view.

The base-material layer 45 has a rectangular or substantially rectangular shape having shorter sides with the same length as that of a side of the base-material layers 42 to 44, and longer sides with a greater length than that of the shorter sides thereof. On one main surface (a lower surface in FIG. 7) of the base-material layer 45, a conductor pattern 45A is provided. The conductor pattern 45A has a band shape extending in the longitudinal direction of the base-material layer 45. The base-material layer 45 is laminated on the base-material layer 44, such that the one main surface thereof which is provided with the conductor pattern 45A is closer to the base-material layer 44.

The base-material layer 45 has a greater length in the longitudinal direction than that of a side of the base-material layer 44. Therefore, in the case where the base-material layer 45 is laminated on the base-material layer 44 such that one end portion of the base-material layer 45 is aligned with the base-material layer 44, the base-material layer 45 includes a portion overlapping with the base-material layers 42 to 44, and a portion not overlapping therewith, in a plan view. The conductor pattern 45A straddles both the portion overlapping with the base-material layers 42 to 44 and the portion which is not overlapping therewith, and the conductor pattern 45A is exposed at its portion located in the portion not overlapping therewith. Further, a resist is provided on the exposed portion of the conductor pattern 45A. In this case, the resist is not provided on the end portion of the conductor pattern 45A, and this end portion is exposed. A connector 100 is provided on the exposed end portion of the conductor pattern 45A. This exposed one end portion of the conductor pattern 45A is an example of "the first terminal portion".

The conductor pattern 45A is connected, at its other end, to one end of the conductor pattern 44A, namely one end of the coil 4A, through the via conductor 44B. The via conductor 44B and the conductor pattern 45A are an example of "the conductor line path".

In the inductor device 4 configured as described above, the portion of the layer-laminated member 40 in which all the base-material layers 41 to 45 overlap with each other (the portion having the five layers) is referred to as a greater-thickness portion 40A. Further, the portion thereof which includes only the base-material layer 41 (the portion having the single layer) is referred to as a smaller-thickness portion 40B, and the portion thereof which includes only the base-material layer 45 (the portion having the single layer) is referred to as a smaller-thickness portion 40C. Namely, the smaller-thickness portions 40B and 40C are located in the respective opposite end portions of the layer-laminated member 40 in the direction of layer lamination. Further, the coil 4A is located in the greater thickness portion 40A. The one end of the conductor pattern 41B as a mounting electrode is located in the smaller-thickness portions 40B, and one end of the conductor pattern 45A is located in the smaller-thickness portion 40C.

The inductor device 4 is mounted on a substrate, using one ends of the conductor patterns 41B and 45A, as mounting electrodes. In the present preferred embodiment, the connectors 101 and 100 are mounted to the mounting electrodes. Further, the inductor device 4 is connected to the substrate through the connectors 101 and 100. Since the inductor device 4 is able to be connected to the substrate through the connectors 101 and 100, it is not necessary to perform soldering, which makes it easier to perform the connection operation.

The one ends of the conductor patterns 41B and 45A, which are the mounting electrodes in the inductor device 4, are located near the respective opposite end portions of the layer-laminated member 40 in the direction of layer lamination. Namely, the via conductor 44B and the conductor pattern 45A which are derived from one end of the coil 4A in the direction of layer lamination, and the conductor pattern 41B derived from the other end of the coil 4A are not located near the coil 4A along the direction of layer lamination. This significantly reduces or prevents the occurrence of electric power losses due to magnetic fields generated from the coil 4A, similarly to the first to third preferred embodiments.

Further, similarly to the second and third preferred embodiments, the one ends of the conductor patterns 41B and 45A as the mounting electrodes do not overlap with the coil 4A in a plan view, which significantly reduces or prevents the occurrence of stray capacitances between the one ends of the conductor patterns 41B and 45A and the coil 4A. This significantly reduces or prevents the risk of fluctuations of the characteristics of the coil 4A, due to the occurrence of such stray capacitances.

Further, the inductor device 4 is able to be mounted on a substrate including a level difference, similarly to the first and second preferred embodiments.

Further, in comparison with the third preferred embodiment, the number of the base-material layers which are laminated is reduced, without changing the number of windings in the coil. This enables reduction of the height of the inductor device 4.

Fifth Preferred Embodiment

Hereinafter, an inductor device according to the fifth preferred embodiment of the present invention will be described. While, in the first to fourth preferred embodiments, each of the two mounting electrodes is provided on each one main surface (the lower surfaces in the respective figures) of base-material layers, in the present preferred embodiment, one of two mounting electrodes is provided on one main surface (a front surface, for example) of a base-material layer, and the other one of them is provided on the other main surface (a back surface, for example) of the base-material layer.

Figure 8:
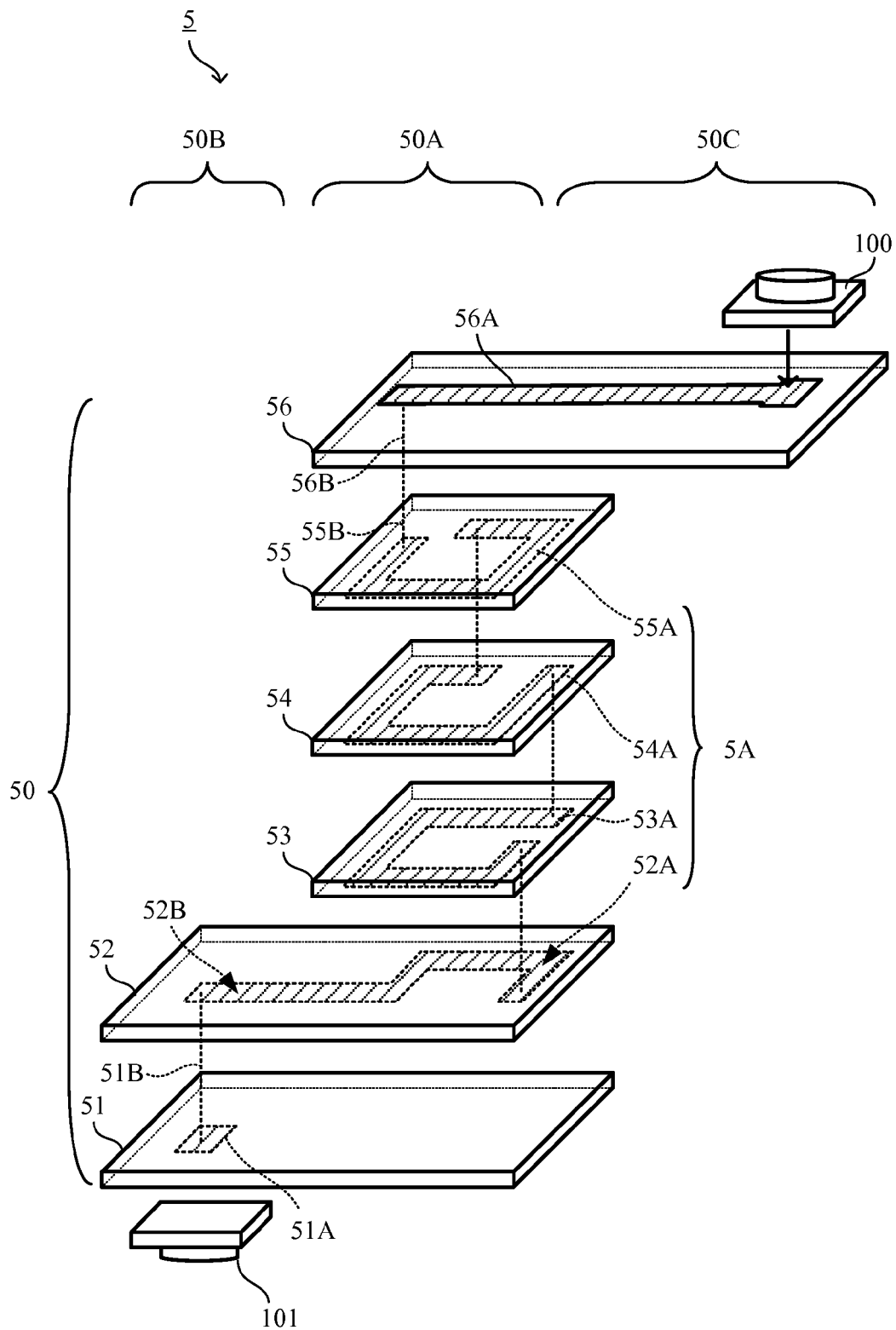
FIG. 8 is an exploded perspective view of an inductor device according to a fifth preferred embodiment of the present invention.

FIG. 8 is an exploded perspective view of the inductor device according to the fifth preferred embodiment. FIG. 8 illustrates a view of the same in a partially-transparent manner.

An inductor device 5 includes a layer-laminated member provided with a coil 5A. The layer-laminated member 50 includes base-material layers 51, 52, 53, 54, 55 and 56 made of a thermoplastic resin having flexibility, such as an LCP resin, which have been thermally pressed.

The base-material layers 51, 52, 53 and 54 are the same as the base-material layers 31, 32, 33 and 34 according to the third preferred embodiment. Further, conductor patterns 51A, 52A, 52B, 53A and 54A which are provided on the lower surfaces of the base-material layers 51, 52, 53 and 54 are the same as the conductor patterns 31A, 32A, 32B, 33A and 34A according to the third preferred embodiment. The conductor pattern 51A is an example of "the second terminal portion". Further, in the base-material layer 51, a via conductor 51B located at a position overlapping with the conductor pattern 51A in a plan view, and a conductor pattern 52B are an example of "the conductor line path".

The base-material layer 55 has the same or substantially the same size and the same shape as those of the base-material layers 53 and 54. On one main surface (a lower surface in FIG. 8) thereof, there is provided a conductor pattern 55A. The base-material layer 55 is laminated on the base-material layer 54, such that this one main surface is closer to the base-material layer 54. The conductor pattern 55A has a band shape and is wound in such a way as to define an interior space. The conductor pattern 55A overlaps with the conductor pattern 54A, when the base-material layer 55 is laminated on the base-material layer 54. The conductor pattern 55A is connected, at its one end, to one end of the conductor pattern 54A, through a via conductor in the base-material layer 54.

These conductor patterns 52A, 53A, 54A and 55A are connected to each other through the via conductors to define the coil 5A.

Further, in the base-material layer 55, there is provided a via conductor 55B at a position which overlaps with the conductor pattern 55A in a plan view.

The base-material layer 56 has a rectangular or substantially rectangular shape having shorter sides with the same length as that of a side of the base-material layers 53 to 55, and longer sides with a greater length than that of the shorter sides thereof. On one main surface (an upper surface in FIG. 8) of the base-material layer 56, a conductor pattern 56A is provided. The conductor pattern 56A has a band shape extending in the longitudinal direction of the base-material layer 56. The base-material layer 56 is laminated on the base-material layer 55, such that the other main surface thereof which is opposite from the one main surface provided with the conductor pattern 56A is closer to the base-material layer 55. Then, in the case where the base-material layer 56 is laminated on the base-material layer 55 such that one end portion of the base-material layer 56 is aligned with the base-material layer 55, the base-material layer 56 includes a portion overlapping with the base-material layers 53 to 55, and a portion not overlapping therewith, in a plan view. The conductor pattern 56A straddles the portion overlapping with the base-material layers 53 to 55 and the portion not overlapping therewith.

In the base-material layer 56, there is provided a via conductor 56B at a position which overlaps with the conductor pattern 56A in a plan view and, also, overlaps with the via conductor 55B when the base-material layer 56 is laminated on the base-material layer 55.

The conductor pattern 56A is connected, at its one end, to one end of the conductor pattern 55A through the via conductors 55B and 56B which are provided on the respective base-material layers 55 and 56. Further, the conductor pattern 56A is exposed, and a resist is provided on the conductor pattern 56A. In this case, the resist is not provided on the other end of the conductor pattern 56A in the opposite side from the one end thereof which is connected to the conductor pattern 55A, and this other end of the conductor pattern 56A is exposed. This exposed portion is an example of "the first terminal portion". Further, the via conductors 55B and 56B and the conductor pattern 56A are an example of "the conductor line path".

In the inductor device 5 configured as described above, the portion of the layer-laminated member 50 in which all the base-material layers 51 to 56 overlap with each other (the portion having the six layers) is referred to as a greater-thickness portion 50A. Further, the portion of the layer-laminated member 50 in which only the base-material layers 51 and 52 overlap with each other (the portion having the two layers) is referred to as a smaller-thickness portion 50B, and the portion thereof in which there is only the base-material layer 56 (the portion having the single layer) is referred to as a smaller-thickness portion 50C. Namely, the smaller-thickness portions 50B and 50C are located in the respective opposite end portions of the layer-laminated member 50 in the direction of layer lamination. Further, the coil 5A is located in the greater-thickness portion 50A. The conductor pattern 51A and one end of the conductor pattern 56A are located in the smaller-thickness portions 50B and 50C.

The conductor pattern 51A, and the other end of the conductor pattern 56A, which are the mounting electrodes in the inductor device 5, are located near the respective opposite end portions of the layer-laminated member 50 in the direction of layer lamination. Namely, the via conductors 55B and 56B and the conductor pattern 56A which are derived from one end of the coil 5A in the direction of layer lamination, and the conductor pattern 52B and the via conductor 51B which are derived from the other end of the coil 5A are not located near the coil 5A along the direction of layer lamination. This significantly reduces or prevents the occurrence of electric power losses due to magnetic fields generated from the coil 5A, similarly to the first to fourth preferred embodiments.

Further, the conductor pattern 51A and the other end of the conductor pattern 56A do not overlap with the coil 5A in a plan view, which significantly reduces or prevents the occurrence of stray capacitances between the conductor pattern 51A and the other end of the conductor pattern 56A and the coil 5A. This significantly reduces or prevents the risk of fluctuations of the characteristics of the coil 5A, due to the occurrence of such stray capacitances.

Further, since the conductor pattern 51A and the other end of the conductor pattern 56A as the mounting surfaces are at different positions in the direction of layer lamination, the inductor device 5 is able to be mounted on a substrate including a level difference, as described with reference to FIG. 2. Further, the inductor device 5 includes the mounting electrodes on one main surface of the base-material layer 51 as the lowermost layer (which will be referred to as a lower surface, hereinafter) in the layer-laminated member 50, and on the other main surface of the base-material layer 56 as the uppermost layer (which will be referred to as an upper surface, hereinafter). Therefore, the inductor device 5 is able to be mounted to straddle two substrates having respective mounting surfaces provided oppositely to each other with a distance interposed therebetween.

Figure 9:
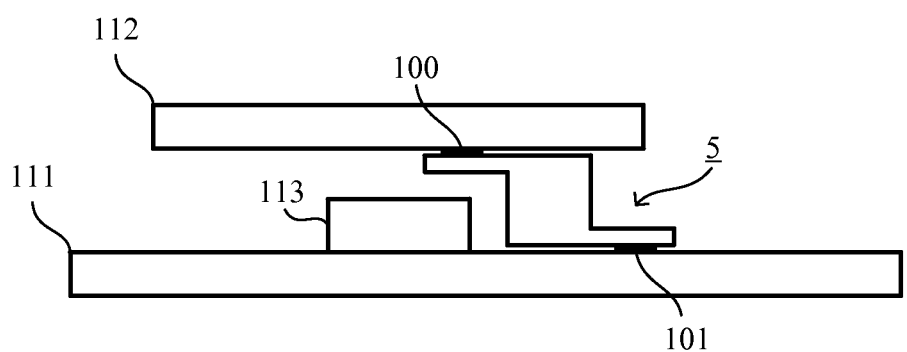
FIG. 9 is a view for illustrating an aspect where the inductor device according to the fifth preferred embodiment of the present invention is mounted.

FIG. 9 is a view for illustrating an aspect where the inductor device 5 according to the fifth preferred embodiment is mounted. Two substrates 111 and 112 that mount the inductor device 5 thereon are provided such that respective mounting surfaces therein are opposed to each other with a distance interposed therebetween. In cases where the inductor device 5 is mounted on these two substrates 111 and 112, a connector 100 provided on the upper surface of the base-material layer 56 as the uppermost layer in the layer-laminated member 50 is connected to the substrate 112, and a connector 101 provided on the lower surface of the base-material layer 51 as the lowermost layer is connected to the substrate 111, so that the inductor device 5 is able to be mounted on the substrates 111 and 112.

Further, since the base-material layer 56 in the inductor device 5 includes a portion which does not overlap with the other base-material layers, even when a mounted component 113 is mounted on the substrate 111, and a mounting electrode on the substrate 112 is positioned just above the mounted component 113, the inductor device 5 is able to be mounted on the substrates 111 and 112, as illustrated in FIG. 9.

As described above, the inductor device 5 is able to be mounted on a substrate including a level difference, similarly to the first to fourth preferred embodiments, and, further, is able to be mounted on different substrates located oppositely to each other as illustrated in FIG. 9.

Further, the inductor devices according to the aforementioned first to fifth preferred embodiments can be also used as common mode choke coils or antennas. Further, inductor devices included in electronic apparatuses can be constituted by the inductor devices according to the first to fifth preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An inductor device comprising:
a layer-laminated member including base-material layers laminated; and
a coil located in the layer-laminated member with a winding axis coincident with a direction of layer lamination; wherein
the layer-laminated member includes a smaller-thickness portion positioned near one end portion thereof in the direction of layer lamination, and a greater-thickness portion with a greater number of base-material layers laminated therein than that in the smaller-thickness portion;
the coil is located in the greater-thickness portion;
the coil is connected, at one end positioned near one end portion of the layer-laminated member, to a first terminal portion in the smaller-thickness portion;
the coil is connected, at the other end positioned near the other end portion of the layer-laminated member, to a second terminal portion in a base-material layer located near the other end portion of the layer-laminated member; and
the first terminal portion and the second terminal portion are located at respective different positions in the direction of layer lamination.

2. The inductor device according to claim 1, wherein the first terminal portion and the second terminal portion are located at positions which prevent respective conductor line paths which connect both the ends of the coil to the first terminal portion and the second terminal portion from being located in the greater-thickness portion, along a direction of the winding axis of the coil, near a side of the coil.

3. The inductor device according to claim 1, wherein the first terminal portion and the second terminal portion are located at positions which do not overlap with the coil, in a plan view of the layer-laminated member.

4. The inductor device according to claim 1, wherein
the smaller-thickness portion has flexibility; and
a connector is connected to the first terminal portion in the smaller-thickness portion.

5. The inductor device according to claim 1, wherein
the layer-laminated member includes two or more smaller-thickness portions; and
the smaller-thickness portions are located near both the respective end portions of the layer-laminated member in the direction of layer lamination.

6. The inductor device according to claim 1, wherein
the first terminal portion is located on an outermost layer near one end of the layer-laminated member in the direction of layer lamination; and
the second terminal portion is located on an outermost layer near the other end of the layer-laminated member in the direction of layer lamination.

7. The inductor device according to claim 2, wherein the conductor line paths are defined by via conductors.

8. The inductor device according to claim 1, wherein the first terminal portion and the second terminal portion are located on a same main surface of the base-material layers.

9. The inductor device according to claim 1, wherein the first terminal portion and the second terminal portion are located on opposite main surfaces of the base-material layers.

10. An electronic apparatus comprising the inductor device according to claim 1.

11. The electronic apparatus according to claim 10, further comprising a substrate on which the inductor device is mounted.

12. The electronic apparatus according to claim 11, wherein the substrate includes a level difference on which the inductor device is mounted so as to straddle the level difference.

13. The electronic apparatus according to claim 11, further comprising an interposer mounted on the substrate between the substrate and the inductor device.

14. The electronic apparatus according to claim 11, wherein one of the first and second terminal portions is connected to the substrate via solder and the other of the first and second terminal portions is connected to the substrate via a connector.

15. The electronic apparatus according to claim 11, wherein each of the first and second terminal portions is connected to the substrate via a connector.

* * * * *